United States Patent [19]

Kameda et al.

[11] Patent Number: 4,890,151
[45] Date of Patent: Dec. 26, 1989

[54] THIN-FILM AND ITS FORMING METHOD

[75] Inventors: Masahiro Kameda, Ibaragi; Yojiro Kamei; Kenichi Kurihara, both of Ikeda, all of Japan

[73] Assignee: Ricoh Company, Ltd., Tokyo, Japan

[21] Appl. No.: 279,232

[22] Filed: Nov. 29, 1988

Related U.S. Application Data

[63] Continuation of Ser. No. 719,742, Apr. 4, 1985, abandoned, which is a continuation-in-part of Ser. No. 588,659, Mar. 12, 1984, abandoned.

[30] Foreign Application Priority Data

| Mar. 12, 1983 | [JP] | Japan | 58-40007 |
| Aug. 23, 1983 | [JP] | Japan | 58-153409 |
| Aug. 25, 1984 | [JP] | Japan | 59-175830 |
| Oct. 11, 1984 | [JP] | Japan | 59-211255 |
| Dec. 8, 1984 | [JP] | Japan | 59-258467 |

[51] Int. Cl.$^4$ .......................................... H01L 23/48
[52] U.S. Cl. ........................................ 357/65; 357/71; 357/91
[58] Field of Search ............... 357/65, 91, 71, 59 J, 357/67

[56] References Cited

U.S. PATENT DOCUMENTS 4,199,778  4/1980  Masuhara ..................... 357/71 P
4,482,394 11/1984  Heinecke ......................... 357/91

FOREIGN PATENT DOCUMENTS 57-183053 11/1982 Japan.

OTHER PUBLICATIONS

IBM Technical Disclosure Bulletin, vol. 14 #2, Jul. 71, p. 596 by d'Heurle.
IBM Technical Disclosure Bulletin, vol. 14 #1, Jun. 71, by Crowder, p. 198.
IBM Technical Disclosure Bulletin, vol. 14 #1, Jun. 71, p. 260 by Herdzik.
Faith, T. J., "Hillock-Free Integrated-Circuit Metallizations by Al/Al-O Layering," J. Appl. Phys., vol. 52, No. 7, Jul. 1981, pp. 4630-4639.

Primary Examiner—Andrew J. James
Assistant Examiner—Mark Prenty
Attorney, Agent, or Firm—Cooper & Dunham

[57]  ABSTRACT

A method for forming an interconnection pattern of Al on a structure, such as a semiconductor device, includes the step of introducing ions of a selected material, such as As, P, B and Ar, into a film of Al to be formed into an interconnection pattern prior to the step of heat treatment, thereby substantially preventing undesired results, such as hillocks, when the pattern is heat-treated.

18 Claims, 12 Drawing Sheets

THIN-FILM AND ITS FORMING METHOD

CROSS-REFERENCES OF RELATED APPLICATIONS

This is a continuation of application Ser. No. 719,742 filed Apr. 4, 1985, now abandoned, which is a continuation-in-part of application, Ser. No. 588,659, filed Mar. 12, 1984 now abandoned.

BACKGROUND OF THE INVENTION

1. Field of the Invention

This invention relates to a method for forming a thin-film in a desired pattern, and particularly to a method for forming a multilayer interconnection pattern in a process for manufacturing LSIs, in particular MOS-FETs.

2. Description of the Prior Art

In forming interconnections and leads in LSIs in accordance with the prior art, a thin-film of an electrically conductive material, such as Al and Al-Si, is first formed by evaporation, sputtering, etc. and then after patterning, it is subjected to heat treatment at the temperature ranging from 400° C. to 500° C. However, it is known that ridges called whiskers or hillocks are formed at the surface during this heat treatment thereby destroying smoothness in the surface. Such whiskers and hillocks could cause disconnections in interconnection lines due to electromigration, and, in particular, they could cause an electrical short between a first lead layer and a second lead layer in a multilayer interconnection structure, thereby making the multilayer interconnection structure defective.

Japanese Patent Laid-open Publication, No. 57-183053, etc. discloses a method for preventing the formation of whiskers in a main surface of Al by implanting impurities, such as P, As and Ar. In the publication, it is also described that production of whiskers is a phenomenon peculiar to pure Al and no such phenomenon takes place for alloy materials, such as Al-Si. On the other hand, with respect to hillocks, a paper presented by T. J. Faith, in J. Appl. Phys., Vol. 52, No. 7, July 1981, includes a description which indicates that ridges in the form of hillocks may be formed in the surface of pure Al. As described in the *LSI DATA HANDBOOK*, Science Forum Co., pp. 316-323, one approach to prevent the formation of such hillocks is to use an electrically conductive material with an impurity, such as Si, Cu and Mg; however, for Al-Si, for example, the effects are not sufficient, and, for Al-Si-Cu, there are problems including difficulty in etching, Cu residues and contamination inside of the sputtering device by Cu. Another approach is to introduce O, but this cannot be easily put into practice because of an increase in resistance and difficulty in controlling the introduction of O.

Moreover, in forming interconnection patterns in LSIs, chemical wet etching has also been used to etch an Al pattern into a desired pattern. Although wet etching of Al is simple, it can no longer be applied when a desired line width of Al becomes 3 microns or less. One of the reasons for this is the formation of hillocks. Thus, in forming a fine metal pattern, wet etching cannot be applied.

SUMMARY OF THE INVENTION

It is therefore a primary object of the present invention to provide an improved method for forming a fine interconnection pattern.

Another object of the present invention is to provide a method for forming a multilayer interconnection pattern without shorts between layers.

A further object of the present invention is to provide a method for forming a thin-film having a desired pattern on a structure, such as a semiconductor device.

A still further object of the present invention is to provide a method for forming an interconnection pattern high in accuracy and sharpness.

A still further object of the present invention is to prevent hillocks from being formed on leads or interconnection patterns.

Other objects, advantages and novel features of the present invention will become apparent from the following detailed description of the invention when considered in conjunction with the accompanying drawings.

DESCRIPTION OF THE PREFERRED EMBODIMENTS

Figure 2:
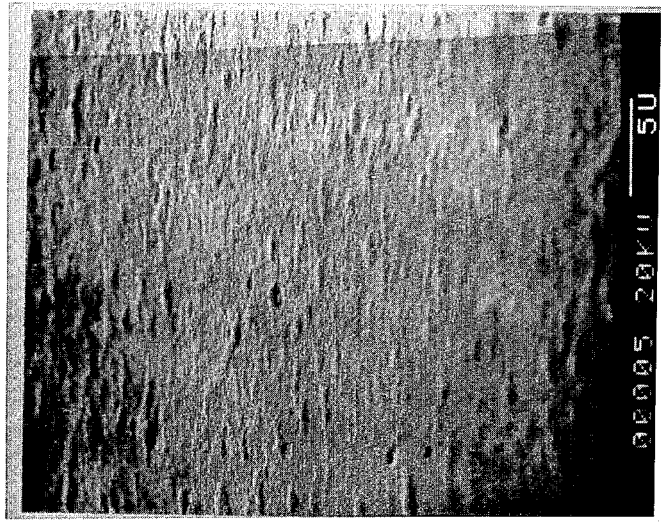
FIG. 2 is an electron microscopic photograph showing the surface of an Al interconnection film formed with the step of ion implantation of B, showing no appreciable hillocks.

Now, the present invention will be described in greater detail by way of its specific embodiments, especially in the case where an interconnection pattern is to be formed on the surface of a nearly completed LSI.

First, using an electrically conductive material, such as Al, Al-Si, Mo, Ti and W, which is commonly used as an interconnection material in the manufacture of an LSI, a film of electrically conductive material is formed to a desired thickness according to any of the well known thin-film forming techniques. For example, it is preferable to form this film to the thickness ranging from 8,000 angstroms to 1 micron by the high speed magnetron sputtering method or the self-rotating type E-gun evaporation method. In the present embodiment, it is assumed that a film of Al is formed to the thickness of 1 micron. Then, ions of an element, such as Ar, As and B, are implanted into this Al film by the well known ion implantation method. In the present embodiment, use is made of As ions. It is preferable to carry out the ion implantation at an energy level of 60 KeV and dose per unit area of $1 \times 10^{16}$ ions/$cm^2$. Moreover, it is preferable to set the ion concentration at $5 \times 10^{17}$ ions/$cm^3$ or more in the vicinity of the surface (in particular, within 2,000 angstroms from the surface), and it is most preferable to set it at $5 \times 10^{20}$ ions/$cm^3$ or more. Then, using a well known photolithography technique, the Al film is etched to define a desired interconnection pattern. Thereafter, as a heat treatment step, the resulting structure is subjected to heat treatment in a nitrogen atmosphere at 450° C. for 30 minutes.

The mechanism of production of hillocks is said to stem from anisotropic growth which takes place due to thermal stresses caused by heat treatment around the crystalline nuclei locally present in the vicinity of the surface. With this as a premise, in accordance with the present invention, a step of ion implantation is added prior to the step of heat treatment with the intention that crystalline nuclei be purposely produced to such an extent that they are uniformly distributed over the entire surface, thereby causing production of nuclei and thus anisotropic growth uniformly over the entire surface to prevent the production of hillocks locally. Described in greater detail, an Al film formed, for example, by evaporation is considered to be non-uniform in its internal structure. And, if there is any non-uniform structural portion locally in the vicinity of the surface, there is a possibility that the local thermal stress produced by such a non-uniform structural portion at a later heat treatment step could cause the formation of hillocks.

In accordance with the present invention, however, since the structural quality of an Al film is made uniform by having ions of a predetermined element implanted into the Al film prior to the step of heat treatment, whereby the film composition in the vicinity of the Al film surface, in particular, is positively made uniform by the introduction of implanted ions, the occurrence of thermal stress concentration is prevented at the time of heat treatment. It is to be noted that, in the embodiment described above, as a means for causing a uniform growth of nuclei over the entire surface by forming crystalline nuclei uniformly throughout the thin-film with the application of energy to the film, use has been made of the ion implantation method which is well known in the field of semiconductor technology. It should however be noted that the present invention is not limited only to such a method and a generally used method of introducing ions, such as reverse sputtering and plasma treatment, may also be used.

Figure 1:
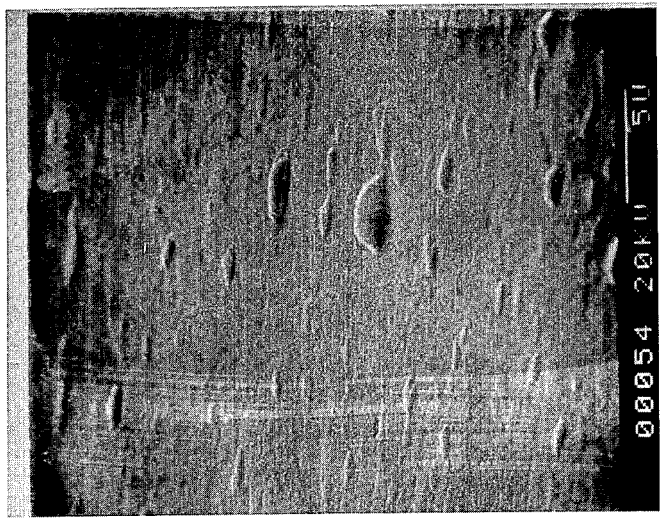
FIG. 1 is an electron microscopic photograph showing the surface of an Al interconnection film formed without the step of ion implantation showing appreciable hillocks.
Figure 3:
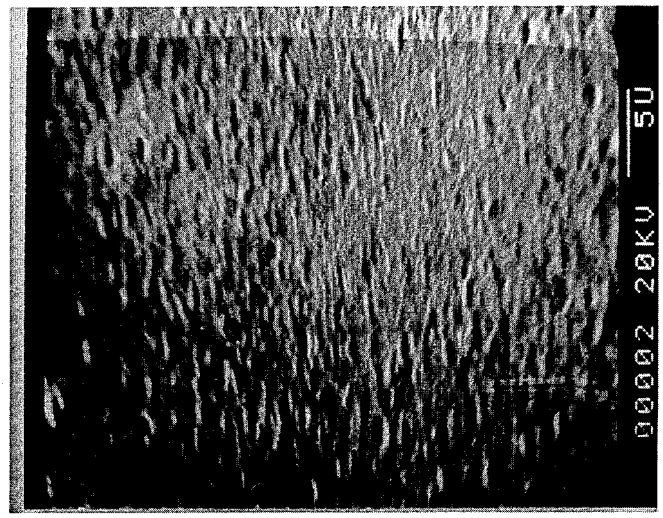
FIG. 3 is an electron microscopic photograph showing the surface of an Al interconnection film formed with the step of ion implantation of As, showing no appreciable hillocks.

In order to confirm the principle of the present invention, the surfaces of electrically conductive layers formed by the prior art method without the step of ion implantation and the method of the present invention with the step of ion implantation have been examined using a scanning electron microscope (SEM) and the resulting electron microscopic photographs are shown in FIGS. 1 through 3. FIG. 1 shows the surface of an Al interconnection layer formed by the prior art method without the step of ion implantation before the step of heat treatment. It is seen that appreciable hillocks are formed in the surface. On the other hand, FIG. 2 shows the surface of an Al interconnection layer formed in accordance with the present invention with the step of ion implantation of B carried out prior to the step of heat treatment. No appreciable hillocks are seen in the surface. FIG. 3 shows an Al layer formed similarly by the present invention using As ions instead of B ions, and there is no difficulty in appreciating that there are no appreciable hillocks formed in the surface.

Now, another aspect of the present invention in which an Al film is wet-etched to define a desired pattern will be described.

First, using Al, which is commonly used as an interconnection material in the manufacture of an LSI, a film of electrically conductive material is formed to a desired thickness according to any of the well known thin-film forming techniques. For example, it is preferable to form this film to thickness ranging from 8,000 angstroms to 1 micron by the high speed magnetron sputtering method or the self-rotating type E-gun evaporation method. Here, it is assumed that a film of Al is formed to the thickness of 1 micron. Then, ions of an element, such as Ar, As and B, are implanted into this Al film by the well known ion implantation method. In the present embodiment, use is made of As ions. It is preferable to carry out the ion implantation at an energy level of 60 KeV and dose per unit area of $1 \times 10^{16}$ ions/cm$^2$. It is preferable to set the ion concentration at $5 \times 10^{17}$ ions/cm$^3$ or more in the vicinity of the surface (in particular, within 2,000 angstroms from the surface), and it is most preferable to set it at $5 \times 10^{20}$ ions/cm$^3$ or more. Then, after applying resist over the entire surface, this resist is formed into a desired pattern.

The Al film thus patterned is then subjected to wet etching using an etching solution containing phosphoric acid, sulfuric acid and acetic acid at the ratio of 3:0.17:0.6, thereby forming a desired interconnection pattern. Thereafter, as a heat treatment step, the resulting structure is heat-treated first in a nitrogen atmosphere at 430° C. for 20 minutes and then in a hydrogen atmosphere for 20 minutes.

Figure 4:
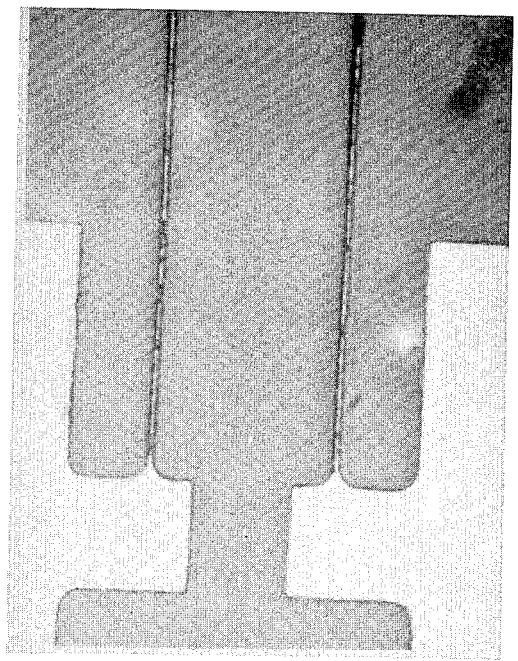
FIG. 4 is an electron microscopic photograph showing an Al interconnection pattern with the line width of 2.25 microns, which has been formed by wet etching without the step of ion implantation.
Figure 5:
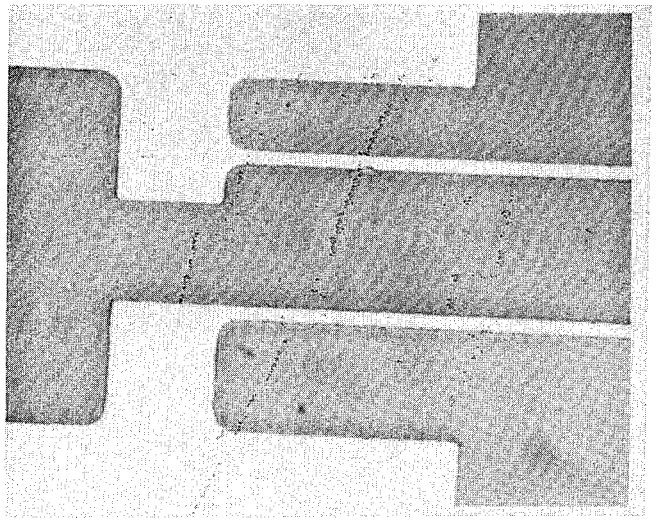
FIG. 5 is an electron microscopic photograph showing an Al interconnection pattern with line width of 3.5 microns, which has been formed by wet etching without the step of ion implantation.
Figure 6:
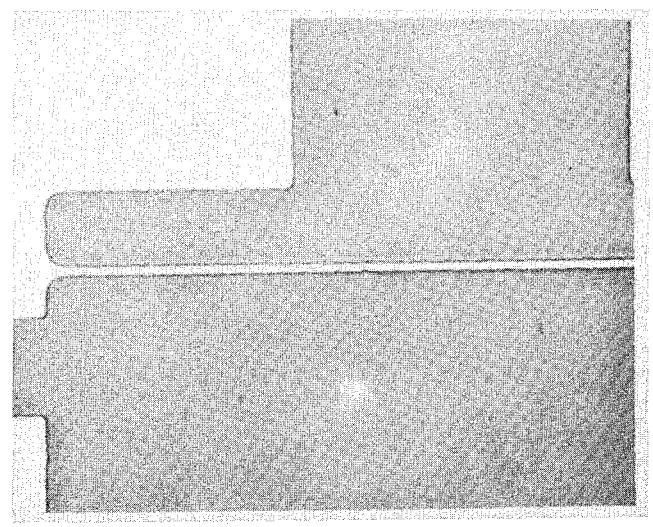
FIG. 6 is an electron microscopic photograph showing an Al interconnection pattern with line width of 2.25 microns, which has been formed by wet etching with the step of ion implantation of P.
Figure 7:
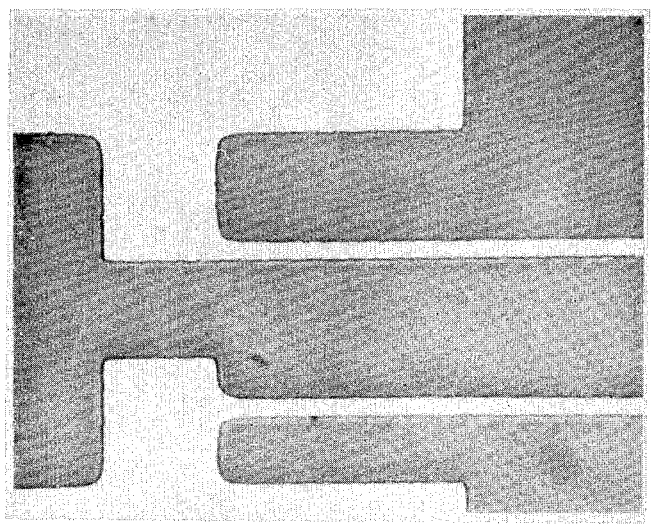
FIG. 7 is an electron microscopic photograph showing an Al interconnection pattern with line width of 3.5 microns, which has been, formed by wet etching with the step of ion implantation of P.

Al interconnection patterns at line widths of 2.25 microns and 3.5 microns were wet-etched first without the step of ion implantation prior thereto and then with the step of ion implantation and the resulting structures were comparatively examined. FIG. 4 shows the Al pattern wet-etched at line width of 2.25 microns without the step of ion implantation. It is easily seen that lines are not clearly cut. FIG. 5 shows the case in which the Al layer was wet-etched at line width of 3.5 microns without the step of ion implantation. A few projections extending into the cut lines are seen, and they could cause bridging between the adjacent layers. FIG. 6 is the case in which the Al layer was wet-etched at line width of 2.25 microns with the step of ion implantation of P prior to the step of heat treatment, and FIG. 7 is the case for line width of 3.5 microns with the step of ion implantation of P. As shown, the etched lines are sharper and no appreciable hillocks or projections are seen.

Another embodiment of the invention will now be described as applied to forming a double-layer Al interconnection pattern. Using the Al interconnection layer thus formed in a desired pattern as described in the last preceding embodiment as a first electrically conductive layer, a layer of phosphosilicate glass (PSG) containing 2% by mole of phosphorous is formed on the first electrically conductive layer to the thickness of 8,000 angstroms as an interlayer insulating film. Then, photolithography and etching as well known in the are art carried out to define through-holes in the interlayer insulating film at desired positions. Then, Al is deposited over the entire surface. Then, the thus deposited Al layer is formed into a desired pattern thereby defining a second electrically conductive layer, which is isolated from the first electrically conductive layer by the interlayer insulating film except for those portions connected through the through-holes. Thereafter, the resulting structure is subjected to heat treatment first in a nitrogen atmosphere and then in a hydrogen atmosphere at the temperature of 430° C.

Figure 8:
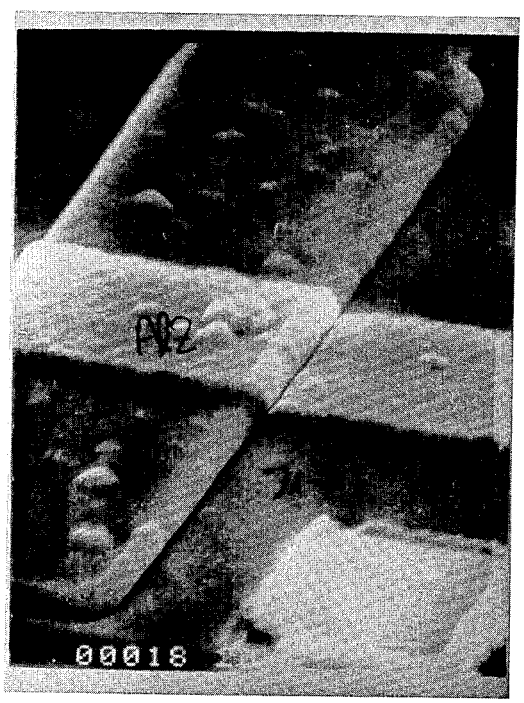
FIG. 8 is an electron microscopic photograph showing a double-layer interconnection pattern of Al formed without the step of ion implantation.
Figure 9:
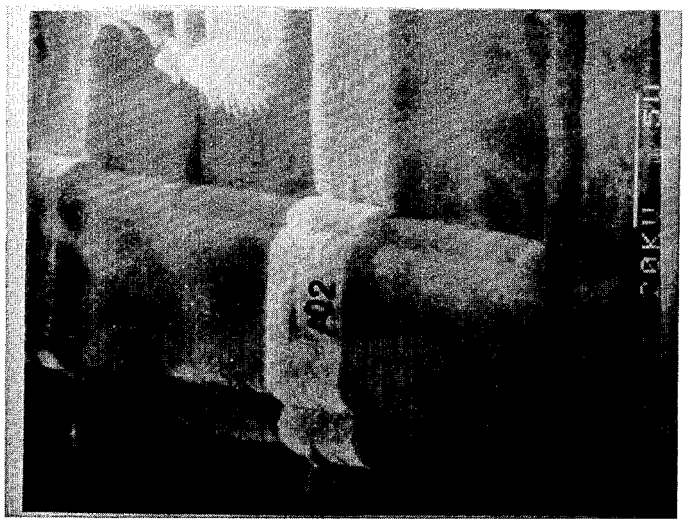
FIG. 9 is an electron microscopic photograph showing a double-layer interconnection pattern of Al formed with the step of ion implantation of B.

The double-layer Al interconnection structure thus formed was examined by a SEM and its electron microscopic photograph is shown in FIG. 9. As may be easily appreciated from this photograph, no appreciable hillocks are formed in the surface of the structure. Besides, the pattern is sharp and accurate and an excellent coverage is attained. In contrast, FIG. 8 is an electron microscopic photograph showing a double-layer Al interconnection structure formed in accordance with a prior art method without the step of ion implantation. It is seen that appreciable hillocks are formed in the surface.

As may be understood from the last two embodiments, in accordance with this aspect of the present invention, hillocks may be prevented from being formed and a fine interconnection pattern may be defined clearly by applying wet etching. Moreover, in the formation of a two-layer interconnection structure with a first electrically conductive layer having a fine pattern, an excellent coverage by an interlayer insulating film during the process of forming the two-layer interconnection structure may be attained. As described above, in accordance with the present invention, since the formation of hillocks is prevented by the addition of the step of ion implantation, fine interconnection patterns may be defined using wet etching. Furthermore, it is true that dry etching may be used for the formation of a fine pattern in a multilayer interconnection structure, but there was a problem of poor coverage by the interlayer insulating film, which could result in disconnections. On the other hand, in accordance with the present invention, since wet etching may be used positively, the problem of poor coverage is obviated, and a method for forming a fine interconnection pattern excellent in coverage and having no hillocks and disconnections is provided. Particularly, when PSG or the like is used to form the interlayer insulating film in a multilayer interconnection structure, an extremely excellent coverage may be attained by the present invention. Besides, the present invention is particularly useful for the formation of a fine pattern since no irregularities, such as dents and projections, are formed along the etched edges.

A further embodiment of the present invention for forming a multilayer interconnection structure will now be described. Using the magnetron type sputtering method, a film of Al-Si 1% is formed on a Si substrate to the thickness of approximately 6,000 angstroms over the entire surface by evaporation. Then, boron ions are implanted into this Al-Si 1% film by ion implantation at an energy level of 50 KeV and dose per unit area of $1 \times 10^{16}$ ions/cm$^2$. In the vicinity of the surface, particularly within 2,000 angstroms from the surface, the ion concentration is preferably set at $5 \times 10^{17}$ ions/cm$^3$ or more, and most preferably at $5 \times 10^{20}$ ions/cm$^3$ or more. The distribution of ion concentration within the film has a maximum approximately at 1,000 angstroms from the surface. Then, the Al-Si 1% film implanted with ions is etched by an etching solution containing phosphoric acid, nitric acid and acetic acid at the ratio of 3:0.17:0.6 for approximately 2.5 minutes at the temperature of 42° C. to define a desired interconnection pattern. Thereafter, the resulting structure is heat-treated in a nitrogen atmosphere at the temperature of 450° C. for 30 minutes.

Then, an interlayer insulating film of silicon oxide is formed over the entire surface covering the Al-Si 1% film having a desired pattern to the thickness of approximately 8,000 angstroms by the CVD (chemical vapor deposition) method. When use is made of the low pressure CVD process, the pressure is preferably reduced to 0.1 Torr. Then, a film of OCD (tradename) is formed on the interlayer insulating film to the thickness of approximately 1,200 angstroms. Thereafter, the resulting structure is heat-treated in a nitrogen atmosphere at the temperature of 400° C. Then, selective etching is carried out to define through-holes. Then, pure Al is deposited on the OCD layer over the entire surface by evaporation, which is then etched into a desired pattern thereby forming a second electrically conductive layer of approximately 8,000 angstroms thick.

Figure 11:
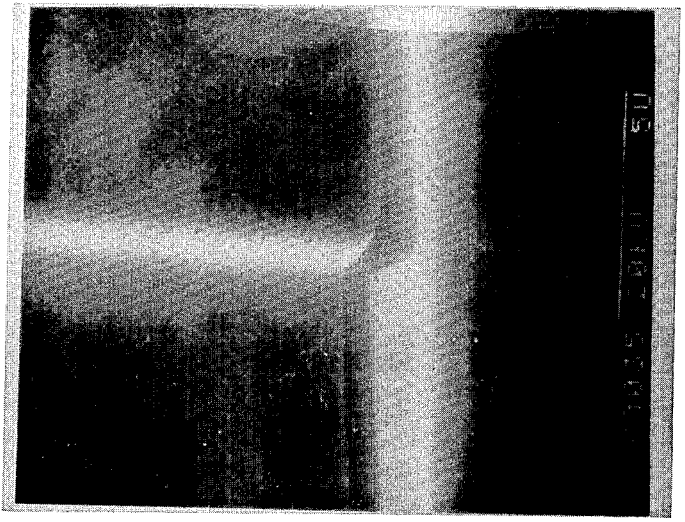
FIG. 11 is an electron microscopic photograph showing the interlayer insulating film shown in FIG. 10 coated with OCD.
Figure 10:
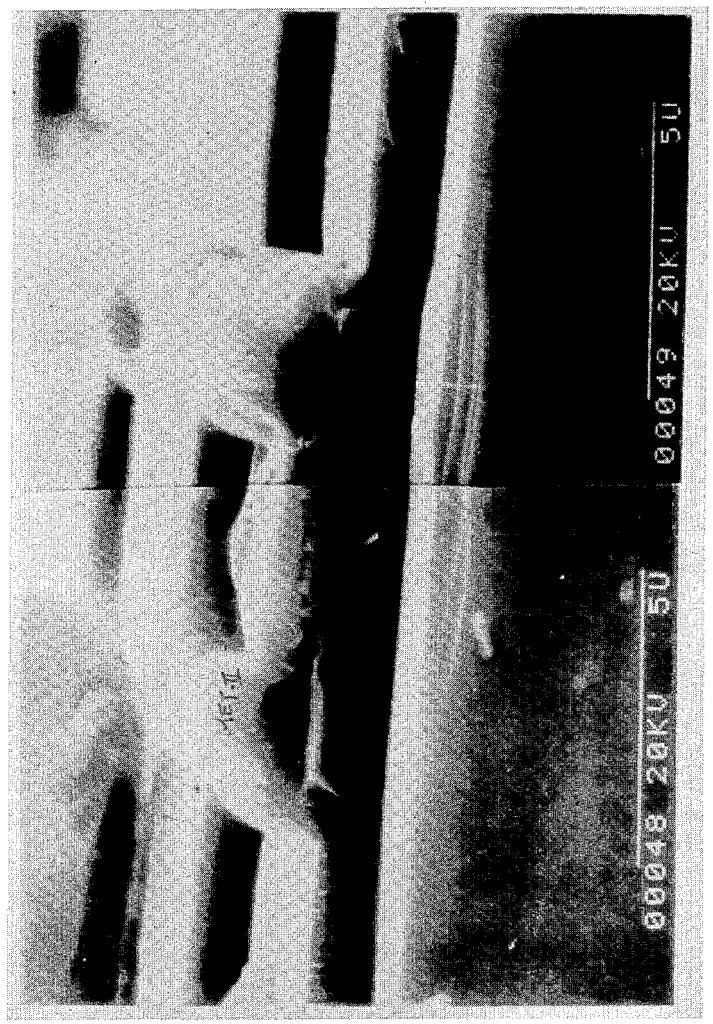
FIG. 10 is an electron microscopic photograph showing a multilayer interconnection structure including an interlayer insulating film formed on a first metal layer by the low pressure CVD method.

FIG. 10 is an electron microscopic photograph showing the two-metal layer interconnection structure having the interlayer insulating film formed by the low pressure CVD process. And, FIG. 11 is an electron microscopic photograph showing OCD coated on the interlayer insulating film. It is to be noted that as an interconnection material, use may be made of a high melting point metal, such as Al-alloys and Mo, and a silicide thereof.

As described above, in accordance with the present invention, it is possible to prevent hillocks from being formed on a metal interconnection layer of semiconductor device by having impurity ions implanted before the step of annealing. According to the systematic study for prevention of hillock production on the interconnection pattern of semiconductor device, it has been found that the production of hillocks can be suppressed almost completely from a practical viewpoint by having impurity ions implanted into a metal interconnection pattern at the dose of approximately $10^{15}$ ions/cm$^2$ or more. This aspect of the present invention will now be described more in detail below.

Figure 12:
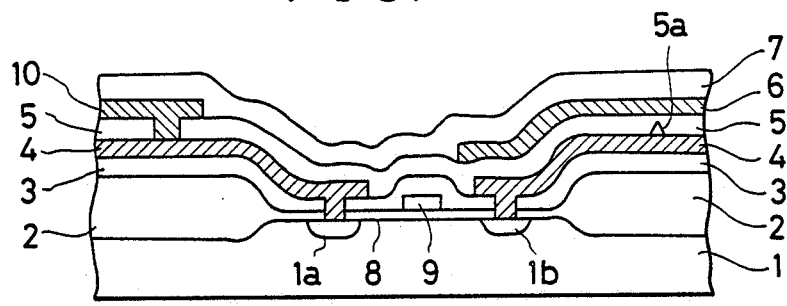
FIG. 12 is a schematic illustration showing the structure of a typical semiconductor device having a multilayer interconnection pattern.

FIG. 12 is a schematic illustration showing the structure of a typical semiconductor device having a multilayer interconnection pattern, to which the present invention is most advantageously applied to form the interconnection pattern. As shown, as the underlying support structure, there is provided a substrate 1 which is preferably comprised of a semiconductor material, such as silicon, of one conductivity type and which includes a pair of diffusion regions 1a and 1b formed by doping selected impurities of opposite conductivity type. It is to be noted that the substrate 1 may include any other well-known elements, such as buried layers and channel stops. On the substrate 1 is formed a field oxide film 2, typically, from SiO$_2$ to the thickness of approximately 9,000 angstroms. And, a phosphosilicate glass (PSG) film 3 is formed on the field oxide film 2 to the thickness of approximately 8,000 angstroms.

Furthermore, on the PSG film 3 is formed a first metal layer 4, which defines the first layer of to-be-formed multilayer interconnection pattern, to the thickness of approximately 6,000 angstroms, and second metal layers 6 and 10, which define the second layer of the multilayer interconnection pattern, are formed to the thickness of approximately 9,000 angstroms with a PSG layer 5 as an interlayer insulating layer having the thickness of approximately 8,000 angstroms sandwiched between the first and second metal layers 4 and 6 (10). The topmost layer 7 is a passivation layer having the thickness of approximately 7,000 angstroms. Also provided in the structure shown in FIG. 12 are a gate oxide film 8 of approximately 500 angstroms and a polysilicon gate 9 of approximately 3,500 angstroms. It is to be noted that the particular sizes given above are only for the illustrative purpose and the present invention is no way limited only to these. In the preferred embodiment, use is made of pure Al or an alloy of Al and Si for forming either of the metal layers 4, 6 and 10.

In the structure shown in FIG. 12, it is assumed for the purpose of illustration that the left-hand first metal layer 4 and the second metal layer 10 are interconnected by a via extending through a through-hole, but the right-hand first metal layer 4 and the second metal layer 6 are electrically isolated from each other by the interlayer insulating layer 5. In this case, if the step of ion implantation of impurity ions at a predetermined dose level or more is not carried out after formation of the first metal layer 4, there will be produced hillocks as indicated by 5a on the top surface of the first metal layer 4 when the entire structure is subjected to heat-treatment, so that the first and second metal layer 4 and 6 may be shorted by such a hillock extending through the interlayer insulating layer 5. In accordance with this aspect of the present invention, there is provided a method of preventing the production of hillocks by carrying out the step of ion implantation with impurities at the dose level of approximately $10^{15}$ ions/cm$^2$ from the exposed surface of the first metal layer subsequent to the formation thereof from a selected electrically conductive material. With the implantation of impurity ions at dose of approximately $10^{15}$ ions/cm$^2$, it is possible to prevent hillocks from being produced even if the first metal 4 is subjected to heat-treatment thereafter.

As described previously, it is considered that the production of hillocks takes place because particular directions of crystal growth are defined in a metal layer when it is formed, for example, by evaporation or sputtering, and the anisotropic crystal growth takes place depending on such particular directions when subjected to heat-treatment. However, according to this aspect of the present invention, it is considered that such particular crystal growth directions are completely destroyed by having impurity ions implanted at the dose level of approximately $10^{15}$ ions/cm$^2$ or more, preferably $10^{16}$ ions/cm$^2$ or more, after formation of a metal layer thereby forming an amorphous-like structure random in orientation, which allows to prevent the production of hillocks from occurring.

It is to be noted that the remaining portions of the structure shown in FIG. 12 may be formed by technologies commonly used in the manufacture of semiconductor devices, such as photolithography and etching.

Figure 13:
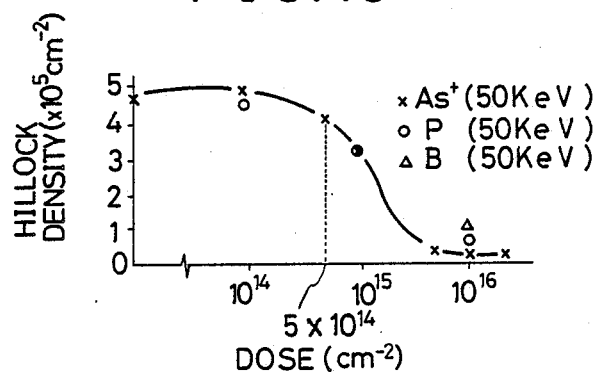
FIG. 13 is a graph showing the relation between the dose and the hillock density, which is obtained by plotting the experimental results for the implanted ions of As+, P and B.

FIG. 13 is a graph showing the experimental results as plotted with the abscissa taken for dose level and the ordinate taken for hillock density. In this experiment, after formation of a metal layer of Al on a supporting structure, such as semiconductor device, ions of selected impurities, such as As, P and B, were implanted into the metal layer and the number of hillocks produced on the metal surface after heat-treatment were counted. And the experiment was repeated by varying the dose of impurity ions. Described more particularly with respect to the present experiment, a PSG layer was formed on a silicon substrate to the thickness ranging from 7,000 to 9,000 angstroms, and, then, a metal layer of Al-Si was formed on the PSG layer to the thickness ranging from 7,000 to 9,000 angstroms by the DC magnetron sputtering process. Then, ion implantation was carried out with selected impurity ions at a dose level in a range between $10^{14}$ and $2\times10^{15}$ ions/cm$^2$, followed by the step of patterning and heat-treatment at 430° C. Thereafter, the number of hillocks produced on the metal layer and having sizes equal to or larger than a predetermined level were counted using observation techniques, such as SEM and XMA.

As shown in the graph of FIG. 13, the present experiment was carried out for impurity ions of As, P and B, and the ion implantation was carried out always at the energy level of 50 KeV. It is easily seen from FIG. 13 that the production of hillocks can be virtually eliminated from a practical viewpoint by including the step of ion implantation at the dose level of approximately $10^{15}$ ions/cm$^2$ or more. It is also seen from the graph of FIG. 3 that the production of hillocks can be prevented almost completely irrespective of the kinds of impurities if the dose level is set at least at $5\times10^{15}$ to $10^{15}$ ions/cm$^2$. It is to be noted that in the present experiment the reference size or height was set at 2,000 angstroms and the number of those hillocks having the height equal to or higher than the reference was counted, because those hillocks could be a problem in coverage.

Figure 14:
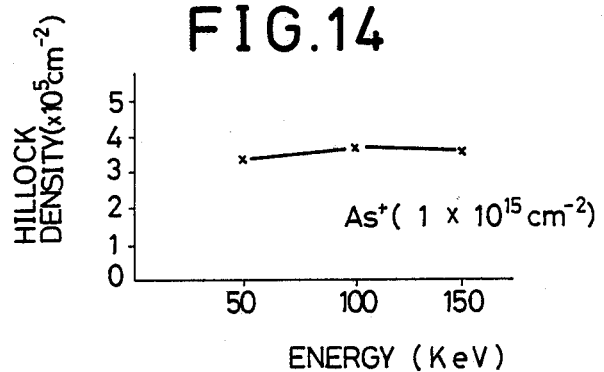
FIG. 14 is a graph showing the relation between the implantation energy and the hillock density, which is obtained by plotting the experimental results.

FIG. 14 graphically shows the experimentally obtained relation between the implantation energy taken for the abscissa and the hillock density taken for the ordinate. In this case, As ions were implanted at the dose of $10^{15}$ ions/cm$^2$, wherein the implantation energy was varied to see the dependency of the hillock density on implantation energy. As apparent from Fig. 14, the hillock density is substantially independent of the implantation energy in the range of investigation. As will be described more in detail later, it has been found from the surface analysis experiment that the implanted As ions (50 KeV) are mostly present at the depth of 100 angstroms and its vicinity from the surface, and after heat-treatment they are shifted to the depth in a range between 1,000 and 2,000 angstroms.

Figure 15:
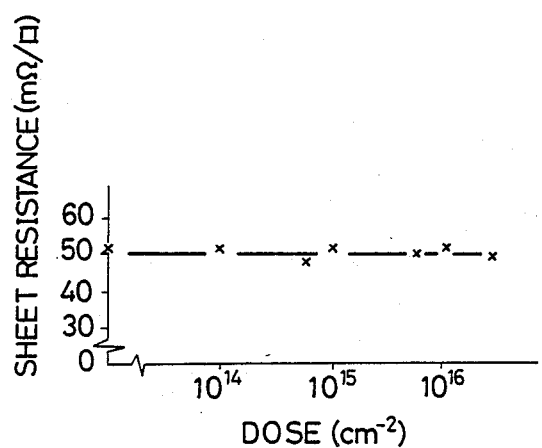
FIG. 15 is a graph showing the relation between the dose and the sheet resistance, which is obtained by plotting the experimental results.
Figure 16:
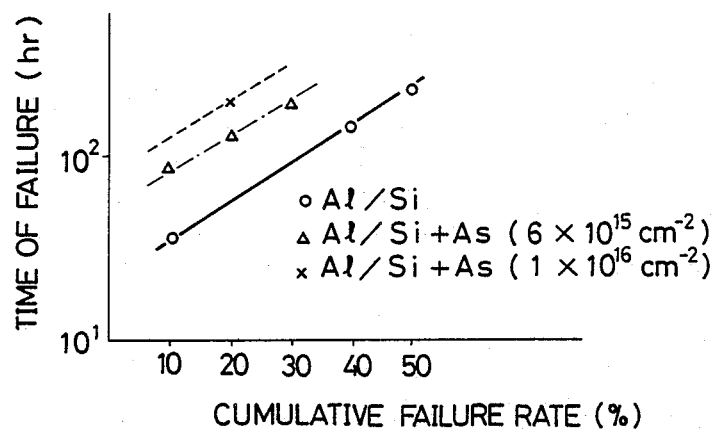
FIG. 16 is a graph showing the relation between the cumulative failure rate and the time of failure, which is obtained by plotting the results of experiments of electromigration.

FIG. 15 is a graph showing the plots of experimental results indicating that the sheet resistance of Al-Si layer remains substantially unchanged over the range of dose where the number of hillocks produced by heat-treatment decreases dramatically. It is thus clear that the resistance of metal layer forming part of interconnection pattern is not adversely affected by the step of ion implantation according to the present invention. Moreover, FIG. 16 shows the results of comparative experiment between the Al-Si film implanted with As ions and the Al-Si film without As implantation, and, as shown, it may be easily understood that durability against electromigration is significantly improved by carrying out the step of ion implantation according to the present invention.

It has also been confirmed experimentally from the analysis of electron beam diffraction pattern for with and without ion implantation of As ions that the diffraction pattern without ion implantation includes continual interference fringes, but the diffraction pattern with ion implantation includes no such interference fringes. From this, it can be said that a crystalline structure of some sort is present in the metal layer after formation, and such a crystalline structure is completely destroyed by the ion implantation at a desired dose level equal to or greater than a predetermined level in accordance with the present invention, thereby converting the crystalline state into the amorphous state or the state of a collection of microcrystalline structures.

Now, a further aspect of the present invention will be described. As described previously, in accordance with the principle of the present invention, the production of hillocks on the surface of a metal layer forming an interconnection pattern is prevented from occurring by carrying out a step of implantation of impurity ions prior to the step of heat-treatment. In accordance with this aspect of the present invention, the production of hillocks is prevented almost completely irrespective of the kind of impurity ions used by carrying out the step of ion implantation such that the depth of impurity ions implanted into the metal interconnection layer, or more specifically the peak of the distribution of impurity ions implanted, is set to be located within 800 angstroms from the surface. That is, in accordance with this aspect of the present invention, after formation of the first metal layer 4 from a selected material in the semiconductor structure shown in FIG. 12, impurity ions are implanted into the first metal layer 4 from its exposed surface such that the implanted ions has a distribution whose peak is located within approximately 800 angstroms from the surface. With the presence of impurity ions so implanted, no hillocks are formed on the first metal layer 4 even if the entire structure is subjected to heat-treatment.

As described previously, it is considered that particular directions of crystal growth are defined in a metal layer when it is formed on a supporting structure and hillocks are produced when anisotropic growth of crystal takes place following these particular directions with the application of heat. However, in accordance with this aspect of the present invention, it is considered that a relatively shallow implantation of impurity ions into a metal layer to define a distribution of implanted ions therein whose peak is located within 800 angstroms, preferably within 500 angstroms, from the surface can cause these particular directions of crystal growth to be completely destroyed, thereby forming an amorphous-like random structure which allows to prevent the formation of hillocks from taking place.

Figure 17:
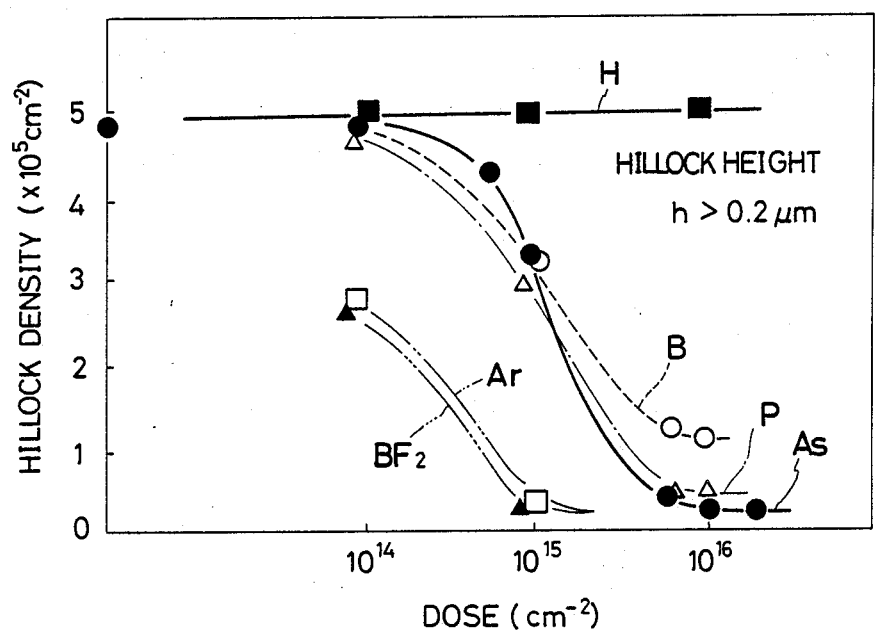
FIG. 17 is a graph showing the relation between the dose and the hillock density, which is obtained by plotting the experimental results for the implanted ions of H, B, P, As, Ar and $BF_2$.

FIG. 17 shows in graphic form the results of the experiment in which a metal layer of Al was formed on a supporting structure, such as a semiconductor device, and impurity ions (As, P, B, Ar or BF$_2$) were implanted into the metal layer by changing the dose level from one test to another prior to the step of heat-treatment, wherein the number of hillocks formed on the metal layer after heat-treatment were counted. In particular, in the present experiment, a PSG layer was formed on a silicon substrate to the thickness of 7,000 to 9,000 angstroms, and, then, a metal layer of Al-Si was formed on the PSG layer to the thickness of 7,000 to 9,000 angstroms by the DC magnetron sputtering process. After carrying out the step of ion implantation at a dose level ranging from $10^{14}$ to $2 \times 10^{16}$ ions/cm$^2$ to the Al-Si layer, patterning and heat-treatment at 430° C. were carried out, followed by the step of observation by SEM or XMA for counting the number of meaningful hillocks.

In the graph of FIG. 17, the abscissa is taken for the dose level per cm$^{-2}$ and the ordinate is taken for the hillock density in number/cm$^2$. In the present example, the ion implantation was carried out always at the energy level of 50 KeV, and the number of those hillocks having sizes or heights larger than a predetermined reference size or height was counted to determine the hillock density. According to the results plotted in the graph of FIG. 17, it is seen that the production of hillocks can be suppressed to a minimum, which is insignificant from a practical viewpoint, if the dose level is set approximately at $10^{15}$ ions/cm$^2$ or higher in the case of using As, P or B as impurity ions and if the dose level is set approximately at $10^{14}$ ions/cm$^2$ or higher in the case of using Ar or BF$_2$ as impurity ions. It is also seen in the graph of FIG. 17 that when the dose level is set at $5 \times 10^{15}$ to $10^{16}$ ions/cm$^2$ or higher, it is possible to prevent hillocks from being produced almost completely irrespective of impurity ions used. Similarly with the previous case, the reference height in counting the number of meaningful hillocks was set at 2,000 angstroms also in the present case.

Figure 18:
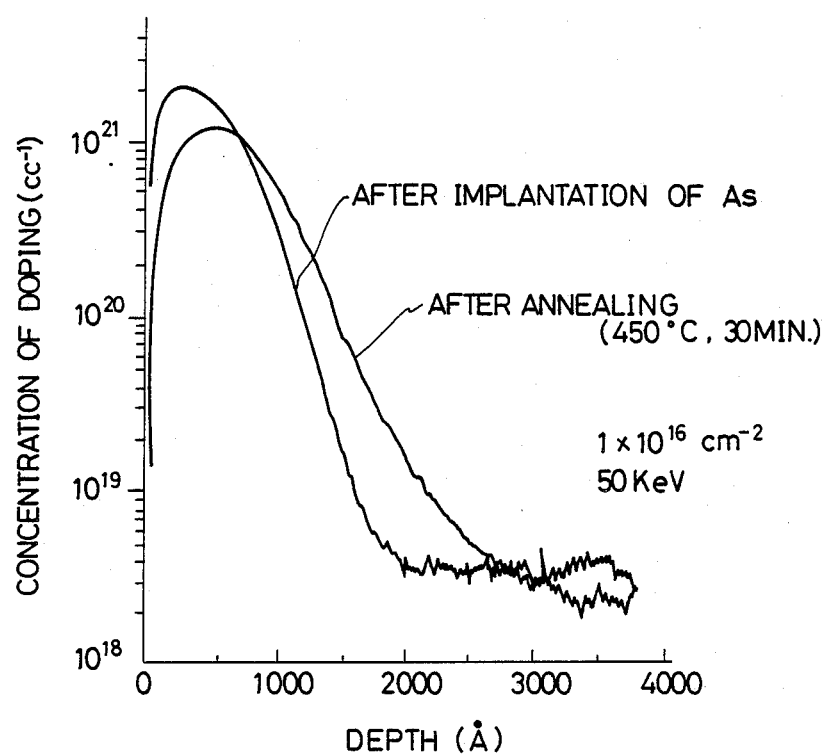
FIG. 18 is a graph showing the distribution of implanted As ions in the direction of depth.
Figure 19:
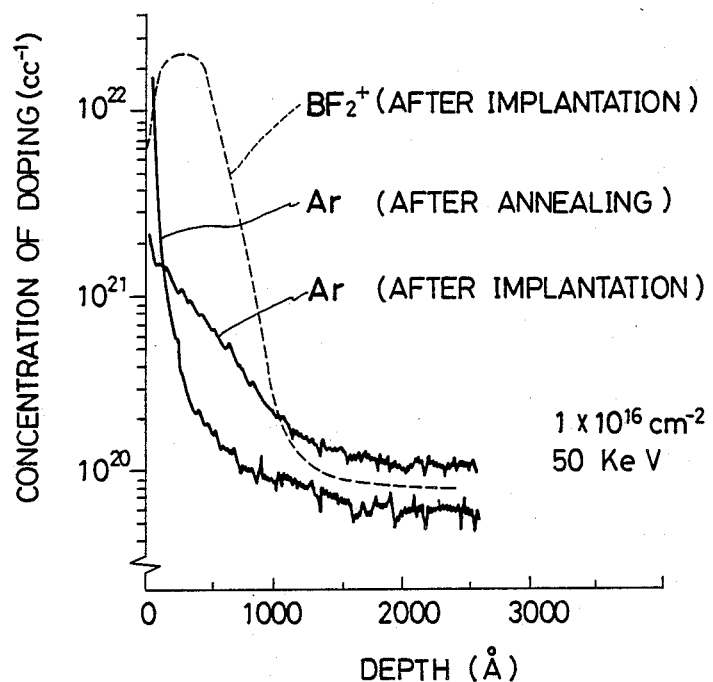
FIG. 19 is a graph showing the distribution of implanted $BF_2^+$ and Ar ions in the direction of depth.

FIGS. 18 and 19 show the distribution of impurity ions implanted into the above-described Al-Si layer when analyzed by SIMS. In the graph of each of these figures, the abscissa is taken for the depth in angstroms as measured from the exposed surface where the ion implantation into the Al-Si layer is carried out and the ordinate is taken for the doping concentration in ions/cc of the impurity ions implanted into the Al-Si layer. FIG. 18 shows the distribution of As ions after the implantation thereof according to the present invention and the distribution of As ions after heat-treatment subsequent to the step of ion implantation. In this case, the implantation of As ions was carried out at the dose level of $1 \times 10^{16}$ ions/cm$^2$ at the energy level of 50 KeV, and the step of heat-treatment was carried out at the temperature of 450° C. for 30 minutes. As apparent from FIG. 18, after the step of implantation of As ions according to the present invention, the peak of the resulting distribution of As ions implanted into the Al-Si layer is located in the vicinity of the surface, approximately ranging between 100 and 300 angstroms. It is also seen that after annealing the peak still remains relatively close to the surface and ranges approximately 500 to 700 angstroms from the surface.

FIG. 19 shows the resulting distributions when Ar and BF$_2$ ions were implanted into the Al-Si layer. As shown, although the distribution of BF$_2$ (when implanted into the Al-Si layer under the same condition as for As shown in FIG. 18) is shifted slightly toward the surface, its peak is located at the position very close to the peak of As distribution shown in FIG. 18. The distribution of BF$_2$ ions after ion implantation is similar to that of As so that it is expected that the distribution of BF$_2$ after heat-treatment is also similar to that of As. The graph of FIG. 19 also includes two distributions of Ar ions, one after ion implantation and the other after annealing. Interestingly, a clear peak is not shown in the distribution of implanted Ar ions, but it is seen that a peak must be present very near the exposed surface. The peak of distribution of Ar ions appears to remain located within 100 angstroms from the exposed surface either after ion implantation or after heat-treatment subsequent to the step of ion implantation. However, within the realm of experimental accuracy, it is relatively difficult to pin-point the location of the peak of As ion distribution.

From above, it can be easily understood that in the case of implanting impurity ions, such as As, P, B, Ar and BF$_2$, into a film of electrically conductive material, if the ion implantation is carried out to define a distribution of implanted ions whose peak is located within 800 angstroms (taking into consideration various fluctuating factors) from the exposed surface, the production of hillocks can be prevented from occurring even if the step of heat-treatment, such as annealing, is carried out thereafter. Although the analysis as to why such a relatively shallow ion implantation is so effective in preventing the formation of hillocks from taking place has not yet been fully conducted, the presence of such effect has been also confirmed by other experimental techniques, such as electronmicroscopic observation and electron beam analysis pattern observation.

A still further aspect of the present invention will now be described. As indicated above, in accordance with the present invention, there is provided a method of manufacturing an interconnection pattern of semiconductor device or the like which comprises the steps of forming a film of electrically conductive material on a supporting structure; implanting impurity ions into the film from its exposed surface; patterning the ion-implanted film to a desired pattern; and subjecting the entire structure to heat-treatment. Preferably, the step of ion implantation is carried out at a dose level of $10^{15}$ ions/cm$^2$ or more. According to this aspect of the present invention, it is preferable to carry out the step of patterning according to dry etching using a positive resist. Furthermore, the dry etching to be carried out for the step of patterning uses a boron-chlorine family gas as an etchant gas.

Described more in detail with respect to this aspect of the present invention by way of embodiments, when patterning the first metal layer 4 in the structure shown in FIG. 12, a selected material is deposited onto the PSG film 3 and then ions of selected impurities are implanted into the thus deposed layer from the exposed surface thereof, which is followed by the step of patterning the first metal layer 4 into a desired pattern according to dry etching using a positive resist, whereby a boron-chlorine family gas, such as BCl$_3$, is used as an etching gas. It has been found experimentally that when etching is carried out using SiCl$_4$ as an etching gas, the shape of metal layer deforms as a result of etching; in particular, it has been found that a step is formed at the edge of metal layer thereby making the entire structure to be in the form of mountain. This tendency has been found to become enhanced as the amount of ion implantation increases. On the contrary, in the case where dry etching is carried out using a boron-chlorine family gas, such as BCl$_3$, no such undesired tendency has been encountered and there has been obtained a clear and sharp etched pattern.

Thus, according to this aspect of the present invention, when manufacturing an interconnection pattern, for example, of a semiconductor device by depositing a metal of selected material onto a supporting structure to form a metal layer thereon, implanting selected impurity ions into the metal layer, applying dry etching to have the metal layer patterned, and subjecting the entire structure to heat-treatment, it is preferred to use a boron-chlorine family gas, such as BCl$_3$, as an etchant during the step of dry etching because the metal pattern is not adversely affected by such etchant and a clear and sharp pattern can be formed without local narrowing or modification in profile.

Figure 20:
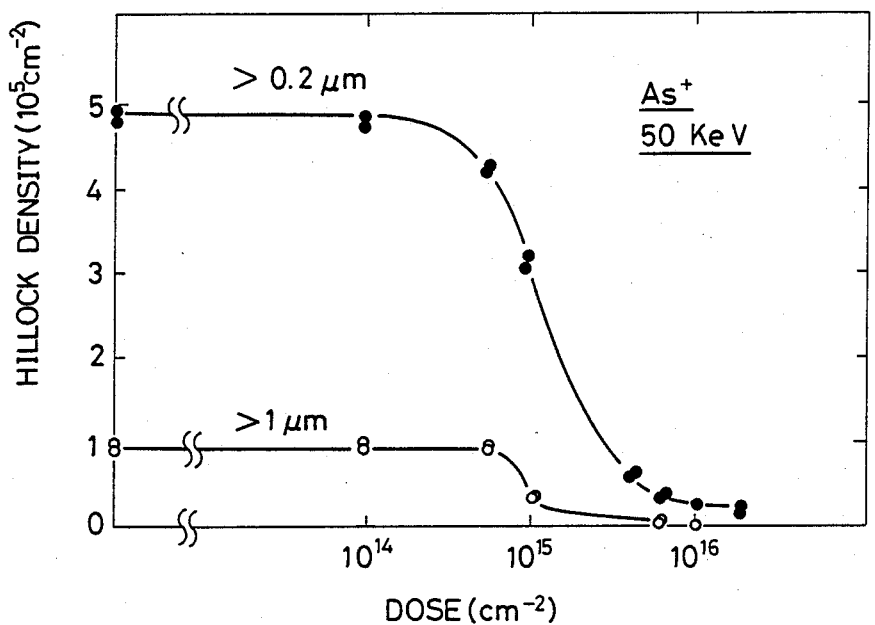
FIG. 20 is a graph showing the relation between the dose and the hillock density for the hillocks of 1 microns or higher and 0.2 microns or higher with the ion implantation of As+ ions at 50 KeV.

FIG. 20 graphically shows the results of experiment conducted in connection with this aspect of the present invention. That is, similarly with the previously described cases, a PSG film of 7,000 to 9,000 angstroms thick was formed on a silicon substrate, and, then, a layer of Al-Si was formed thereon to the thickness of 7,000 to 9,000 angstroms by a DC magnetron sputtering process. Then, after implanting As ions into the Al-Si layer at the energy level of 50 KeV with a variable dose level up to $2 \times 10^{16}$ ions/cm$^2$, the Al-Si layer was patterned by dry etching using BCl$_3$ into a desired pattern and then the entire structure was subjected to heat-treatment at the temperature of 430° C. Thereafter, the surface of the Al-Si layer was examined by an observation technique, such as SEM and XMA, and the number of those hillocks having sizes larger than 1 micron and the number of those hillocks having sizes larger than 0.2 microns were counted. It can be seen that when the ion implantation is carried out at a dose level of $10^{15}$ ions/cm$^2$ or more, no appreciable hillocks are formed. It should also be noted that a sharply cut pattern may be obtained even if patterning is carried out by dry etching.

While the above provides a full and complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. An IC having an electrically insulating layer and an interconnection pattern formed on said electrically insulating layer and comprising a film of an annealed metal material into which hillock-preventing impurities have been introduced following the formation of the film and prior to its annealing, to a dose of at least about $5 \times 10^{14}$ impurity ions per square cm of film and a peak depth after annealing of less than about 800 angstroms from a surface of said interconnection pattern.

2. An IC as in claim 1 in which said dose is at least about $5 \times 10^{15}$ impurity ion per square cm of film.

3. A semiconductor device comprising a supporting structure and an interconnection pattern formed on said supporting structure from a metal material wherein said interconnection pattern includes Ar or $BF_2$ ions implanted therein at a dose level of approximately $10^{14}$ ions/cm$^2$ or more and peak depth after annealing of less than about 800 angstroms from a surface of said interconnection pattern for preventing production of hillocks on said interconnection pattern.

4. The device of claim 3 wherein said supporting structure includes an electrically insulating layer at a top surface thereof and said interconnection pattern is formed on the electrically insulating layer of said supporting structure.

5. A semiconductor device comprising:
a supporting structure;
a first electrically conductive film formed on said supporting structure;
a first electrically conductive film formed on said first electrically insulating film, said first electrically conductive film being selectively removed to define a desired pattern and implanted with ions of a selected material other than those forming said first electrically conductive film to a peak depth after annealing of less than about 800 angstroms from a surface of said first electrically conductive film for preventing production of hillocks on said first electrically conductive firm;
a second electrically insulating film formed on said first electrically conductive film and on that portion of said first electrically insulating film which is not covered by said first electrically conductive film; and
a second electrically conductive film formed on said second electrically insulating film.

6. The device of claim 5 wherein said first electrically conductive film comprises a metal.

7. The device of claim 6 wherein said metal is Al.

8. The device of claim 6 wherein said first electrically conductive film also includes Si.

9. The device of claim 5 wherein said ions are selected from the group consisting of Ar, $BF_2$, As, P and B.

10. The device of claim 5 wherein said supporting structure includes a semiconductor structure.

11. A semiconductor device comprising a supporting structure having an electrically insulating layer at a top surface thereof and an interconnection pattern formed on the electrically insulating layer from a metal material, wherein said interconnection pattern includes ions of a selected material implanted therein at a dose level of approximately $10^{15}$ ions/cm$^2$ or more, said implanted ions having a distribution whose peak after annealing is located at a depth within 800 angstroms from a surface of said interconnection pattern.

12. The device of claim 11 wherein said ions are ions of a material selected from the group consisting of As, P, B, Ar and $BF_2$.

13. The device of claim 11 further comprising an interlayer insulating film formed on said interconnection pattern and an additional interconnection pattern formed on said interlayer insulating film.

14. The device of claim 11 wherein said supporting structure includes at least one PN junction formed therein.

15. The device of claim 14 wherein said supporting structure includes Si.

16. The device of claim 11 wherein said interconnection pattern includes a metal.

17. The device of claim 16 wherein said metal is a material selected from the group consisting of Al, an alloy of Al, Mo, Ti and W.

18. The device of claim 11 wherein said electrically insulating layer is an oxide of the material of said supporting structure.

* * * * *